United States Patent
Guyer (10) Patent No.: US 11,561,695 B1
(45) Date of Patent: Jan. 24, 2023

(54) USING DRIVE COMPRESSION IN UNCOMPRESSED TIER

(71) Applicant: EMC IP HOLDING COMPANY LLC, Hopkinton, MA (US)

(72) Inventor: James M Guyer, Northboro, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 17/367,669

(22) Filed: Jul. 6, 2021

(51) Int. Cl.
*G06F 3/06* (2006.01)
*H03M 7/30* (2006.01)

(52) U.S. Cl.
CPC .......... *G06F 3/0608* (2013.01); *G06F 3/0655* (2013.01); *G06F 3/0659* (2013.01); *G06F 3/0685* (2013.01); *G06F 3/0688* (2013.01); *H03M 7/30* (2013.01)

(58) Field of Classification Search
CPC .... G06F 3/0608; G06F 3/0655; G06F 3/0659; G06F 3/0685; G06F 3/0688; H03M 7/30
See application file for complete search history.

(56) References Cited

U.S. PATENT DOCUMENTS

| | | | | |
|---|---|---|---|---|
| 7,293,133 B1* | 11/2007 | Colgrove | ............... | G06F 3/0608 711/111 |
| 2013/0282982 A1* | 10/2013 | Hayashi | .................. | G06F 3/061 711/E12.017 |
| 2014/0181369 A1* | 6/2014 | Horn | .................... | G06F 12/0246 711/103 |
| 2019/0114083 A1* | 4/2019 | Tiotantra | ............... | G06F 3/0689 |
| 2020/0241805 A1* | 7/2020 | Armangau | ............ | G06F 3/0659 |

* cited by examiner

*Primary Examiner* — Larry T Mackall
(74) *Attorney, Agent, or Firm* — Anderson Gorecki LLP (57) ABSTRACT

In a storage system such as a SAN, NAS, or storage array that implements hierarchical performance tiers based rated drive access latency, on-drive compression is used on data stored on a first tier and off-drive compression is used on data stored on a second tier. Off-drive compression is more processor intensive and may introduce some data access latency but reduces storage requirements. On-drive compression is performed at or near line speed but generally yields lower size reduction ratios than off-drive compression. On-drive compression may be implemented at a higher performance tier whereas off-drive compression may be implemented at a lower performance tier. Further, space saving realized from on-drive compression may be applied to over-provisioning.

19 Claims, 5 Drawing Sheets

Managed Drives 150

Storage Space Savings Applied To Over-provisioning

Tier 1
Drives With Lowest Rated Latency
On-Drive Compression Enabled
Off-Drive Compression Disabled Managed Drives 101

Storage Space Savings Applied To Available Space For Data

Tier 2
Drives With Relatively Higher Rated Latency
On-Drive Compression Disabled/Nonexistent
Off-Drive Compression Enabled

USING DRIVE COMPRESSION IN
UNCOMPRESSED TIER

TECHNICAL FIELD

The subject matter of this disclosure is generally related to electronic data storage, and more particularly to use of on-drive and off-drive compression with hierarchical storage tiering.

BACKGROUND

High-capacity data storage systems such as storage area networks (SANs), storage arrays, and network-attached storage (NAS) are used to maintain large storage objects and contemporaneously support multiple clients or host servers. Such storage systems may include compute nodes that manage access to host application data that is stored on arrays of drives. The drives are typically organized into protection groups such as redundant arrays of independent drives (RAID). The compute nodes respond to input-output (IO) commands from the clients or host applications running on the host servers. Examples of host applications may include, but are not limited to, software for email, accounting, manufacturing, inventory control, and a wide variety of other business processes.

Hierarchical storage tiering is often implemented in high-capacity data storage systems. Identical drives of a single technology type with the same rated data access latency are grouped together to create a tier in which drives are RAID members. Different types of drives are used to create different tiers that are hierarchically organized based on rated performance of the drives. For example, a fast tier could consist of enterprise flash drives (EFDs) and a slow tier could consist of hard disk drives (HDD), where the EFDs have a lower rated access latency than the HDDs. Extents of data are promoted and demoted between the tiers based on frequency of access. Extents that are accessed relatively more frequently are placed on the fast tier and extents that are accessed relatively less frequently are placed on the slow tier.

SUMMARY

In accordance with some aspects an apparatus comprises a storage array comprising: at least one compute node comprising at least one processor and non-transitory computer-readable memory; a first tier of non-volatile drives configured to be accessed by the at least one compute node, each drive of the first tier comprising on-drive compression logic; a second tier of non-volatile drives configured to be accessed by the at least one compute node; off-drive compression logic; a storage tiering engine configured to prompt storage of first data that is accessed relatively more frequently than second data on the first tier and prompt storage of the second data that is accessed relatively less frequently than the first data on the second tier; and a data compression manager configured to: prompt compression of the second data with the off-drive compression logic and storage of compressed second data on the second tier; and prompt the first data to be provided to the first tier uncompressed, the drives of the first tier configured to process the first data with the on-drive compression logic.

In accordance with some implementations a method is implemented by a storage array comprising at least one compute node having at least one processor and non-transitory computer-readable memory, a first tier of non-volatile drives configured to be accessed by the at least one compute node, each drive of the first tier comprising on-drive compression logic, and a second tier of non-volatile drives configured to be accessed by the at least one compute node, the method comprising: prompting storage of first data that is accessed relatively more frequently than second data on the first tier and prompting storage of the second data that is accessed relatively less frequently than the first data on the second tier; prompting compression of the second data with the off-drive compression logic and storage of compressed second data on the second tier; and prompting the first data to be provided to the first tier uncompressed, the drives of the first tier processing the first data with the on-drive compression logic.

In accordance with some implementations a non-transitory computer-readable storage medium stores instructions that when executed by a storage array compute node cause the compute node to perform a method for storing data, the method comprising: prompting storage of first data that is accessed relatively more frequently than second data on a first tier and prompting storage of second data that is accessed relatively less frequently than the first data on a second tier; prompting compression of the second data with off-drive compression logic and storage of compressed second data on the second tier; and prompting the first data to be provided to the first tier uncompressed, the drives of the first tier processing the first data with the on-drive compression logic.

All examples, aspects, implementations, and features mentioned in this disclosure can be combined in any technically possible way. Other aspects, features, and implementations may become apparent in view of the detailed description and figures.

DETAILED DESCRIPTION

The terminology used in this disclosure is intended to be interpreted broadly within the limits of subject matter eligibility. The terms "disk" and "drive" are used interchangeably to refer to non-volatile storage media and are not intended to refer to any specific type of non-volatile storage media. The terms "logical" and "virtual" are used to refer to features that are abstractions of other features, e.g., and without limitation abstractions of tangible features. The term "physical" is used to refer to tangible features that possibly include, but are not limited to, electronic hardware. For example, multiple virtual computers could operate simultaneously on one physical computer. The term "logic" is used to refer to special purpose physical circuit elements, firmware, software, computer instructions that are stored on a non-transitory computer-readable medium and implemented by multi-purpose tangible processors, and any combinations thereof. Aspects of the inventive concepts are described as being implemented in a data storage system that includes host servers and a storage array. Such implementations should not be viewed as limiting. Those of ordinary skill in the art will recognize that there are a wide variety of implementations of the inventive concepts in view of the teachings of the present disclosure.

Some aspects, features, and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e., physical hardware. For practical reasons, not every step, device, and component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

Figure 1:
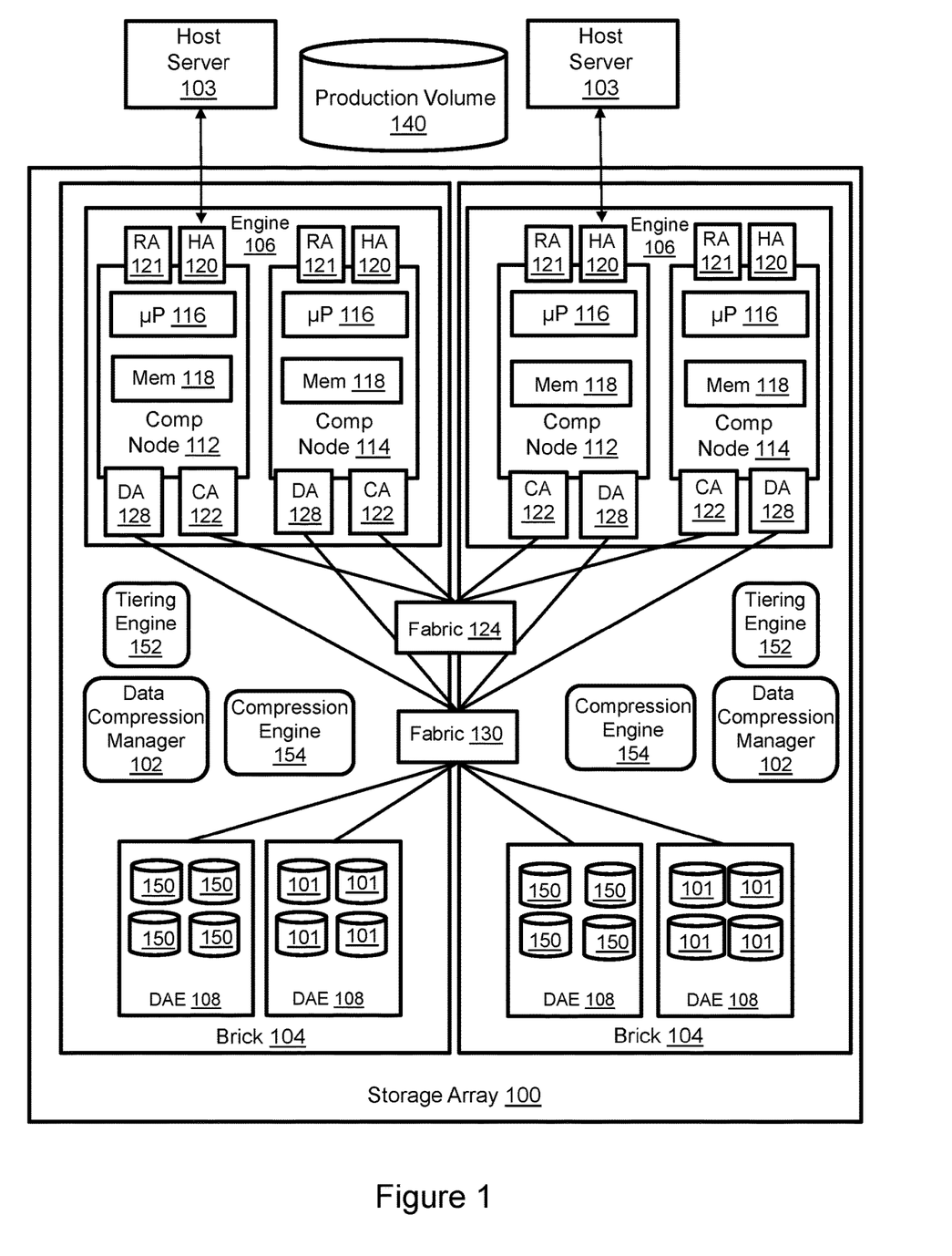
FIG. 1 illustrates a storage array with data compression managers that use on-drive compression to compress data stored on a first tier and uses off-drive compression to compress data stored on a second tier.

FIG. 1 illustrates a storage array 100 with data compression managers that use on-drive compression to compress data stored on a first tier and use off-drive compression to compress data stored on a second tier. The storage array is depicted in a simplified data center environment supporting two host servers 103 that run host applications, but the storage array would typically support more than two host servers. The host servers 103 include volatile memory, non-volatile storage, and one or more tangible processors. The storage array 100 includes one or more bricks 104. Each brick includes an engine 106 and one or more disk array enclosures (DAEs) 108. Each engine 106 includes a pair of interconnected compute nodes 112, 114 that are arranged in a failover relationship and may be referred to as "storage directors." Although it is known in the art to refer to the compute nodes of a SAN as "hosts," that naming convention is avoided in this disclosure to help distinguish the network server hosts 103 from the compute nodes 112, 114. Nevertheless, the host applications could run on the compute nodes, e.g., on virtual machines or in containers. Each compute node includes resources such as at least one multi-core processor 116 and local memory 118. The processors may include central processing units (CPUs), graphics processing units (GPUs), or both. The local memory 118 may include volatile media such as dynamic random-access memory (DRAM), non-volatile memory (NVM) such as storage class memory (SCM), or both. Each compute node includes one or more host adapters (HAs) 120 for communicating with the host servers 103. Each host adapter has resources for servicing input-output commands (IOs) from the host servers. The host adapter resources may include processors, volatile memory, and ports via which the hosts may access the storage array. Each compute node may also include a remote adapter (RA) 121 for communicating with other storage systems, e.g., for remote mirroring, backup, and replication. Each compute node also includes one or more disk adapters (DAs) 128 for communicating with managed drives 101, 150 in the DAEs 108. Each disk adapter has processors, volatile memory, and ports via which the compute node may access the DAEs for servicing IOs. Each compute node may also include one or more channel adapters (CAs) 122 for communicating with other compute nodes via an interconnecting fabric 124.

The managed drives 101, 150 include non-volatile storage media such as, without limitation, EFDs such as solid-state drives (SSDs) based on EEPROM technology such as NAND and NOR flash memory and hard disk disks (HDDs) with spinning disk magnetic storage media. Disk controllers may be associated with the managed drives as is known in the art. An interconnecting fabric 130 enables implementation of an N-way active-active backend. A backend connection group includes all disk adapters that can access the same drive or drives. In some implementations every disk adapter 128 in the storage array can reach every DAE via the fabric 130. Further, in some implementations every disk adapter in the storage array can access every managed drive 101, 150.

Each brick 104 includes a compression engine 154 that provides off-drive data compression. The compression engine may include slow-path, software-based, lossless compression, fast-path hardware offload-based lossless compression, or a combination of both. In general, the compression engine operates with compression algorithms and configuration settings, e.g., compression window size, on larger sizes of data and to a much greater degree of compression than the on-drive data compression logic, therefore additional data access latency is incurred as a result of use of off-drive data compression.

Managed drives 150 include on-drive data compression logic. The on-drive data compression logic may be hardware-based and may operate at or near line speed (within 1% of the rated throughput of the drive and interconnecting link) so little or no data access latency is attributable to on-drive data compression. However, the compression algorithm and configuration settings, e.g., compression window size, may be constrained to providing lower compression ratios relative to the compressibility of the data than the off-drive compression engine. Managed drives 101 may or may not include on-drive data compression logic. If managed drives 101 include on-drive data compression logic, then it is disabled by the data compression manager in some implementations. Managed drives 150 may or may not be of the same technology type, e.g., SSD, as managed drives 101. Further, managed drives 150 may have a lower rated data access latency than managed drives 101, i.e., managed drives 150 may be "faster" than managed drives 101. For context, and without limitation, managed drives 150 in the description below are SSDs and managed drives 101 are SSDs with greater latency than managed drives 150. However, all drives 101, 150 could be characterized by the same technology type, size, or rated access latency, in any combination.

Each brick 104 includes a tiering engine 152 that manages hierarchical storage tiers. In some implementations, each tier only includes drives of a single technology type with the same rated data access latency, e.g., identical drives. In the illustrated example, a fast tier consists of a set of identical SSDs 150 while a slow tier consists of a set of identical HDDs 101. Extents of data are promoted and demoted between the tiers by the tiering engine based on access frequency. Access frequency is tracked using a fixed-duration look-back window. Extents that have been accessed relatively more frequently within the lookback window are placed on the fast tier and extents that have been accessed relatively less frequently within the lookback window are placed on the slow tier. Although only two tiers are described, any number of tiers might be implemented.

Data associated with instances of the hosted applications running on the host servers 103 is maintained on the managed drives 101, 150. The managed drives 101, 150 are not discoverable by the host servers but the storage array creates a logical storage object known as a production volume 140 that can be discovered and accessed by the host servers 103. Without limitation, the storage object may be referred to as a source device, production device, or production LUN, where the logical unit number (LUN) is a number used to identify logical storage volumes in accordance with the small computer system interface (SCSI) protocol. From the perspective of the host servers 103, the production volume 140 is a single drive having a set of contiguous fixed-size logical block addresses (LBAs) on which data used by the instances of the host application resides. However, the host application data is stored at non-contiguous addresses on various managed drives 101, 150. The compute nodes maintain metadata that maps between the production volume 140 and the managed drives 101, 150 in order to process IOs from the hosts.

Figure 2:
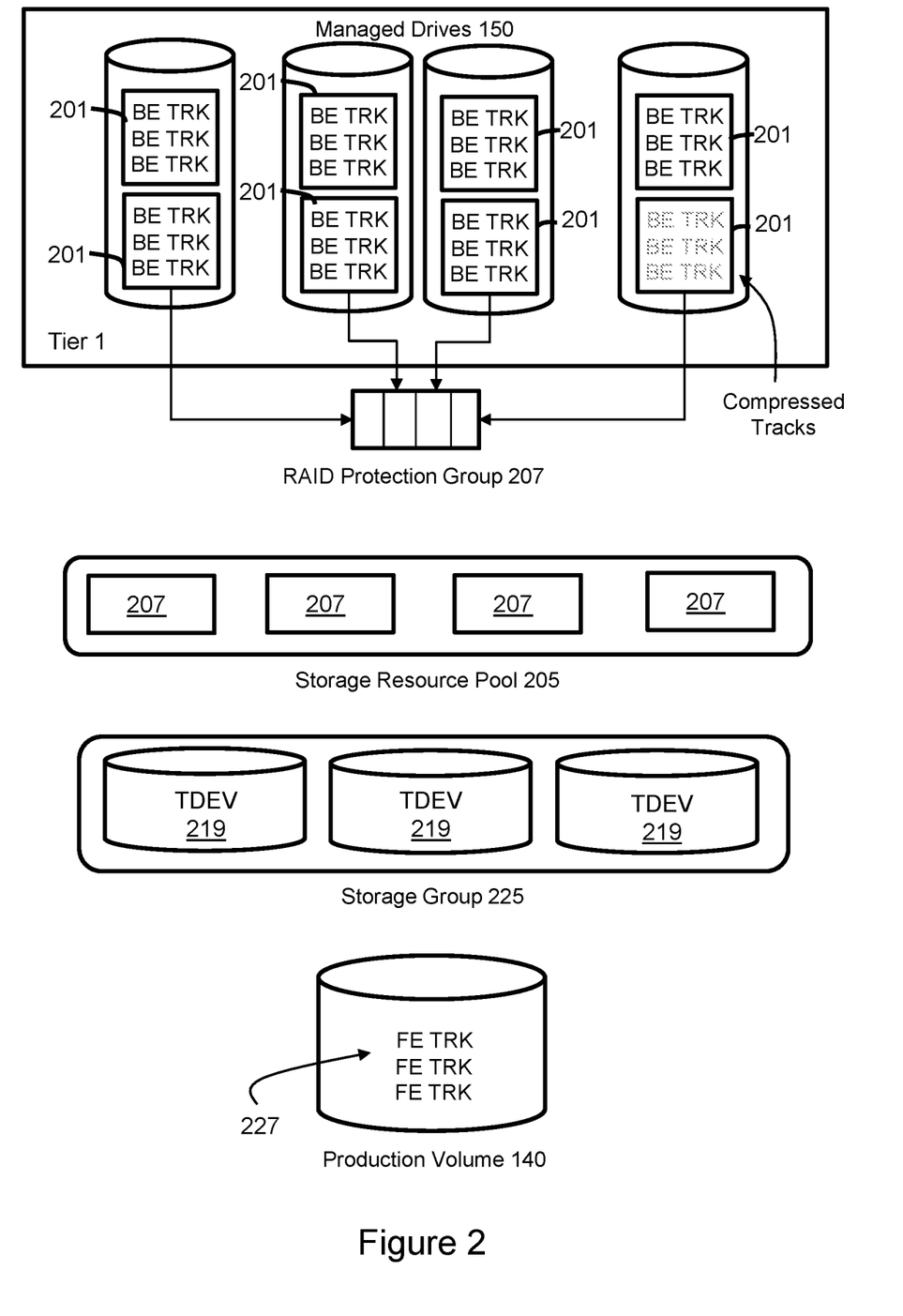
FIG. 2 illustrates layers of abstraction between the managed disks and the production volume of the storage array of FIG. 1.

FIG. 2 illustrates layers of abstraction between managed drives 150 and the production volume 140. The same layers of abstraction exist between managed drives 101 (FIG. 1) and the production volume. The basic allocation unit of storage capacity that is used by the compute nodes to access the managed drives is a back-end track (BE TRK). In some implementations the compute nodes do not access the managed drives using allocation units other than BE TRKs. BE TRKs all have the same fixed logical size that may be an integer (greater than 1) multiple of the managed drive sector size. However, on-drive compression can result in reduction of the actual size of BE TRKs as stored on the managed drives. The managed drives may each be organized into partitions 201 of equal storage capacity, i.e., such that every partition has the same fixed size. Each partition 201 may potentially accommodate multiple BE TRKs. Selection of partition storage capacity is a design implementation and, for context and without limitation, may be some fraction or percentage of the capacity of a managed drive equal to an integer multiple of the sector size. Each partition may include a contiguous range of logical addresses. A group of partitions from different managed drives is used to create a RAID protection group 207. In other words, the partitions accommodate protection group members. Each partition in a protection group must be on a different managed disk in order to be RAID compliant. In some implementations, all of the managed drives associated with a RAID protection group have the same storage capacity. A storage resource pool 205 is a collection of RAID protection groups 207 of the same type, e.g., RAID-5 (3+1). Logical thin devices (TDEVs) 219 are created from a storage resource pool and organized into a storage group 225. The production volume 140 is created from one or more storage groups. Host application data is stored in front-end tracks (FE TRKs) 227, that may be referred to as blocks, on the production volume 140. The FE TRKs 227 on the production volume 140 are mapped to BE TRKs 200 of the managed drives by metadata. The storage array may create and maintain multiple production volumes.

Figure 3:
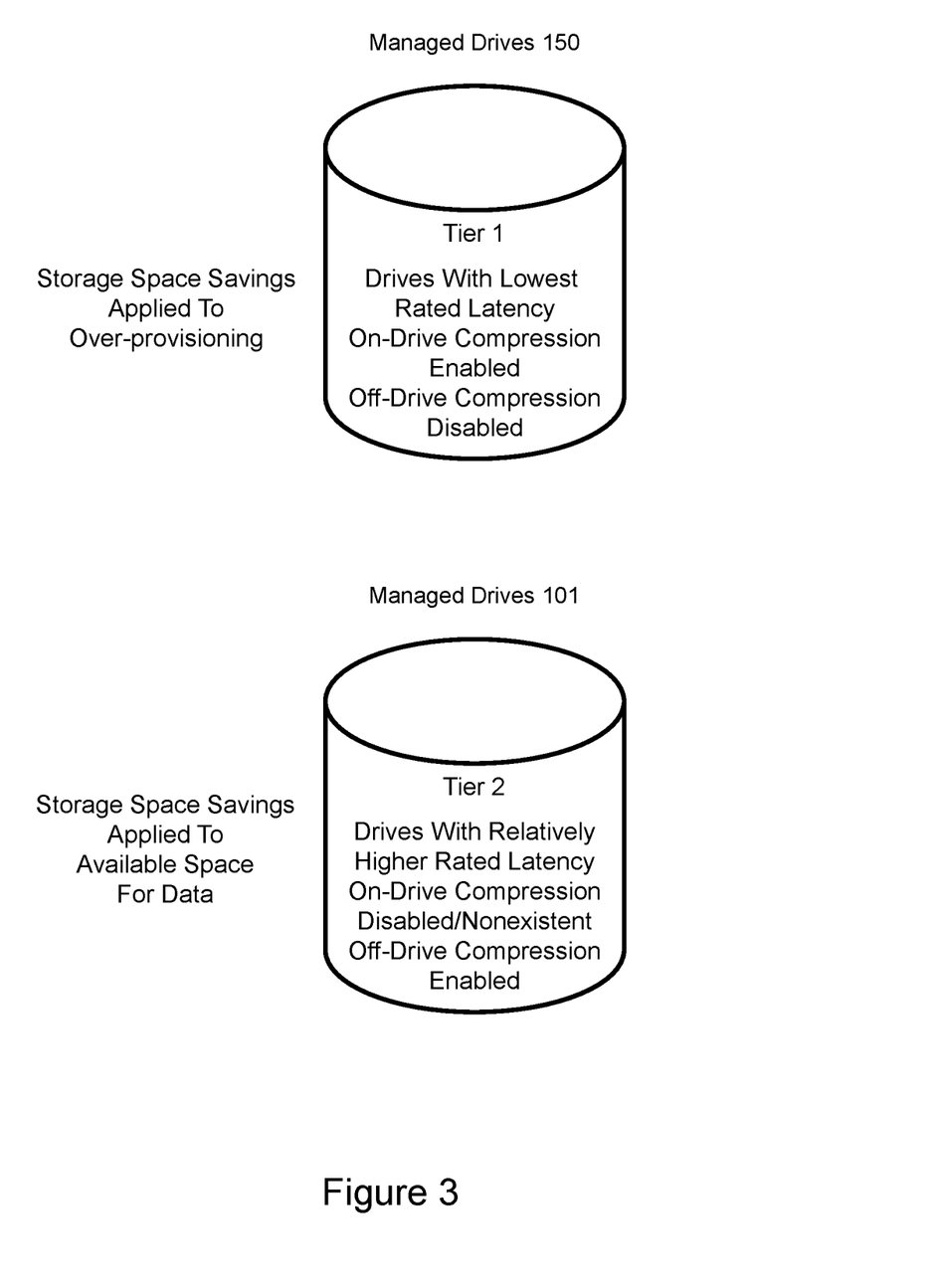
FIG. 3 illustrates hierarchical tiers of storage of the storage array of FIG. 1.

FIG. 3 illustrates hierarchical tiers of storage of the storage array of FIG. 1. Tier 1 (the fast tier) is made up of managed drives 150, which are SSDs with on-drive compression capability in the illustrated example. Tier 2 (the slow tier) is made up of managed drives 101, which are HDDs without on-drive compression capability in the illustrated example. The HDDs are characterized by relatively greater rated data access latency than the SSDs. On-drive compression is enabled on the managed drives 150 in tier 1. On-drive compression is non-existent or disabled on the managed drives 101 in tier 2. Off-drive compression is not implemented with data stored on tier 1. Off-drive compression is implemented with the data stored in tier 2 is applied to available space for data. For example, additional free BE TRKs that would have been used to store uncompressed data will be made available to store additional data due to data reduction resulting from off-drive compression. It should be noted that with off-drive compression, the storage system compresses the data before writing it to the drives. After compression, the storage system knows exactly how much space the data will consume on any drive and can easily manage to find available space. With on-drive compression, the storage system does not know how much space the data will take on the drive before writing it to the drive. Managing the drives is much more difficult when available space is not predictable. Therefore, the storage space saving realized by on-drive compression in the drives of tier 1 is applied to over-provisioning within the drive, but not as space for additional data. In other words, the storage space savings is used for drive management functions in order to improve drive performance. SSDs read and write data in capacity units known as pages, and erase data in units known as blocks that are larger than pages by orders of magnitude. Because of the size difference between pages and blocks, SSDs implement a process known as "garbage collection" to reduce the frequency of erase cycles and reclaim blocks for writing pages of data. When data in non-free blocks is logically updated due to write operations, the new data is written to a page on a free block rather than overwriting the original addresses, and the original addresses on the original block are marked as invalid. Garbage collection algorithms find non-free blocks that contain all or many invalid entries, relocate any remaining valid pages, and recycle the non-free blocks into free (empty) blocks by erasing the invalid data. On-drive compression tends to reduce the number of blocks that are in use, resulting in more free blocks, which facilitates garbage collection and helps to avoid write amplification. Write amplification refers to the fact that an SSD may write more data to the NAND than the storage system writes to the drive, due primarily to the additional write operations associated with garbage collection. The number of additional write operations tends to increase as over-provisioning decreases for random write workloads.

Although no additional data storage per drive is enabled by this invention, implementations may enjoy one or more advantages. On-drive compression results in fewer writes to the memory cells of the tier 1 drives per BE TRK written by the compute nodes. This will result in improved write and read performance by reducing resource consumption to service write operations. Reducing the number of writes to the memory cells also increases drive endurance because NAND memory cells have a finite number of program/erase cycles than can be endured before failure. Compression also reduces the amount of unique valid data on the drives and so reduces the write amplification, further reducing the number of writes enabling additional performance improvement and endurance. Finally, power consumption may also be reduced because writes and erases are power-intensive operations in SSDs.

Figure 4:
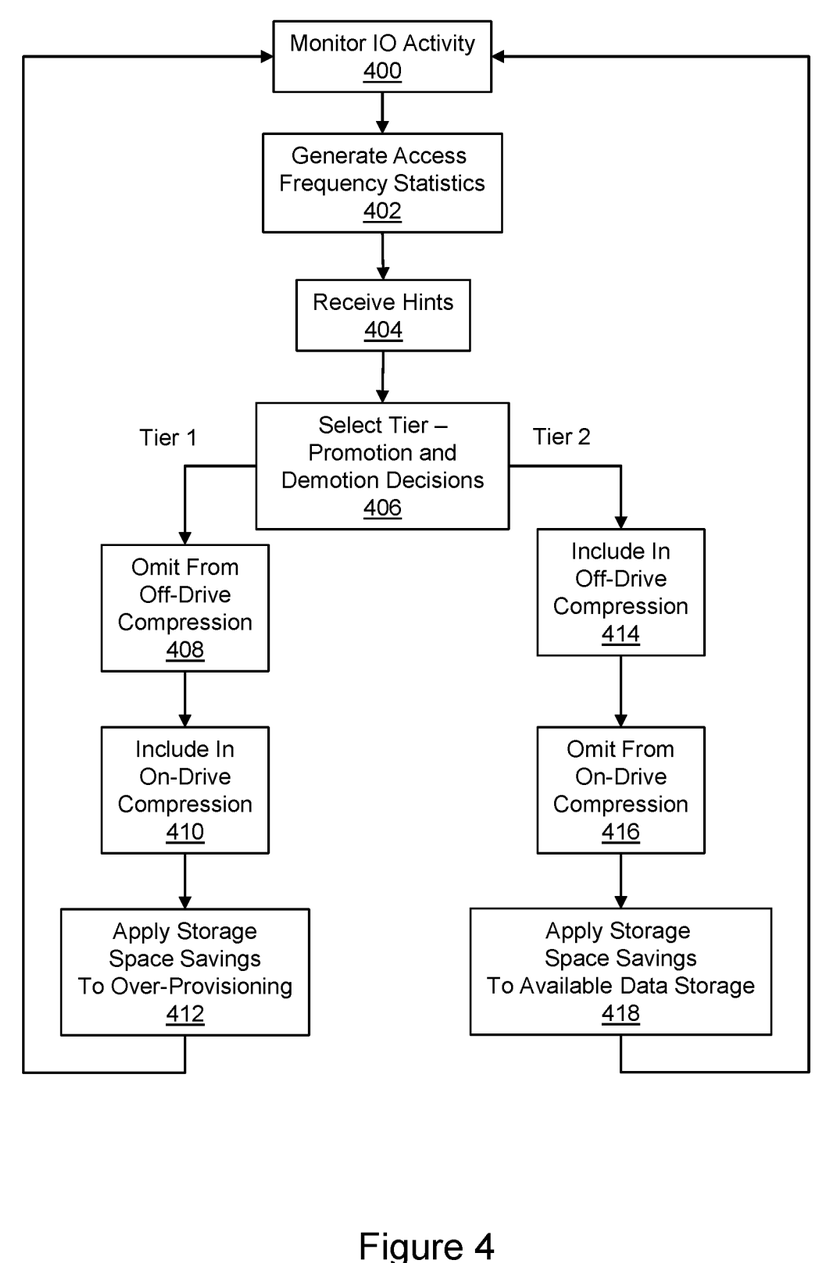
FIG. 4 illustrates a method for using of on-drive and off-drive compression in different hierarchical storage tiers.

FIG. 4 illustrates a method for using of on-drive and off-drive compression in different hierarchical storage tiers. IO activity is monitored as indicated in step 400. This step may include logging accesses to extents with time stamps within a look-back window. Step 402 is generating access frequency statistics. The access frequency statistics may include the number of accesses to extents or other units of data within the look-back window, possibly weighted based on elapsed time since the most recent access. Step 404, which is optional, is receiving hints. Hints may be generated by algorithms or AI models that indicate a likelihood that specified extents will be accessed in the near future, e.g., even if they have not been accessed within the look-back window. The access frequency statistics and hints are used to select a storage tier for certain extents, e.g., that are being newly written or moved. For example, a "cold" extent that had been infrequently accessed in a previous epoch, and recently been accessed and thus become "hot," may be promoted from tier 2 to tier 1. Similarly, a hot extent that had been frequently accessed in a previous epoch, and recently not been accessed and thus became "cold," may be demoted from tier 1 to tier 2. The tiering decisions of step 406 are made by the tiering engines 152 (FIG. 1).

Extents that are being located or promoted to tier 1 are not compressed using off-drive compression as indicated in step 408. The extents are sent uncompressed to the tier 1 drives. On-drive compression is enabled on the tier 1 drives so on-drive compression is applied to the extents as indicated in step 410. The resulting storage space savings is applied to drive over-provisioning as indicated in step 412. In other words, the storage space is used by the drive for more efficient storage management operations rather than to store additional data.

Extents that are being located or demoted to tier 2 are compressed using off-drive compression as indicated in step 414. The extents are sent compressed to the tier 2 drives. On-drive compression is non-existent or disabled on the tier 2 drives so on-drive compression is not applied to the extents as indicated in step 416. The resulting storage space savings is applied to available data storage as indicated in step 418. In other words, the storage space is made available to store additional data.

Figure 5:
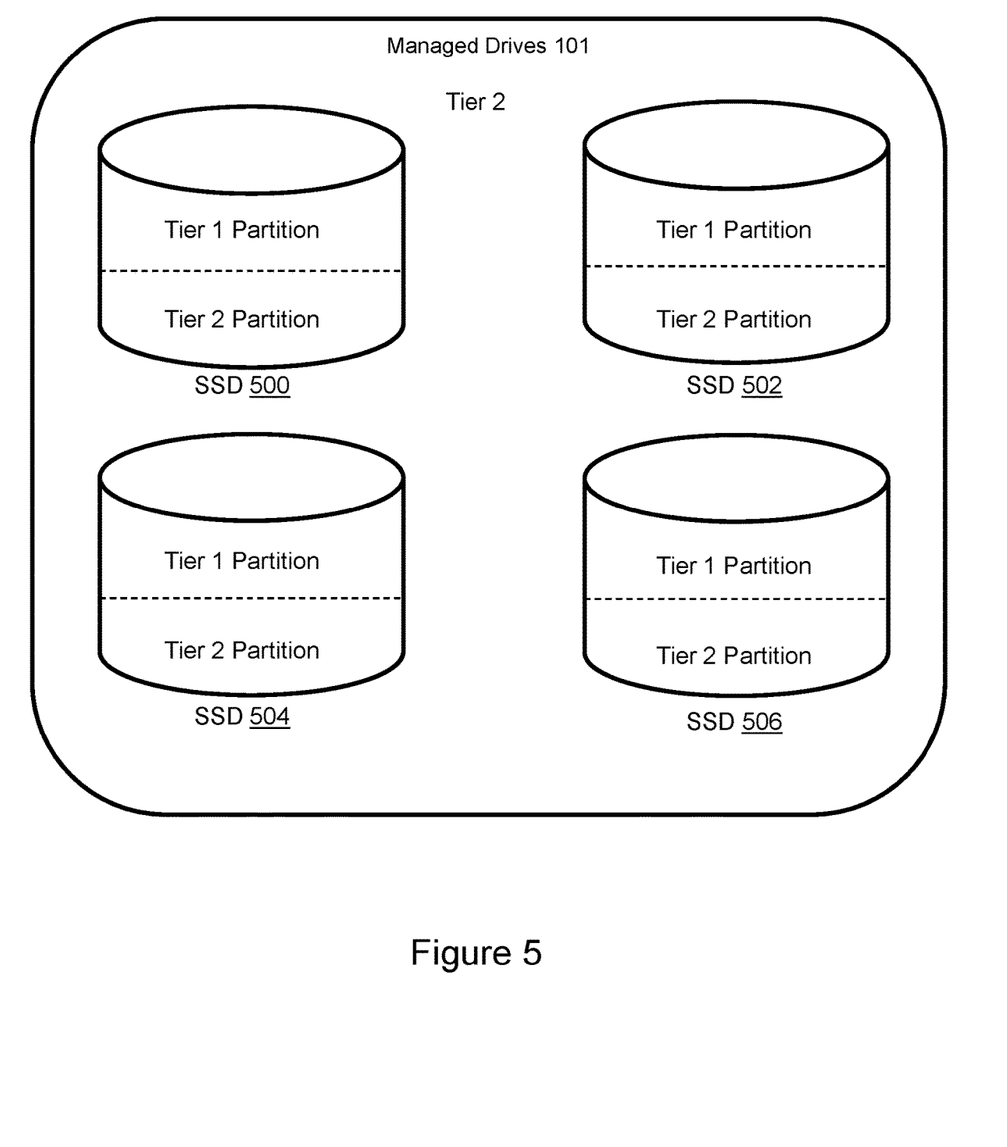
FIG. 5 illustrates use of on-drive and off-drive compression in different partitions of individual drives.

Referring to FIG. 5, another embodiment of this invention will use partitioned SSDs 500, 502, 504, 506 in tier 2. A further embodiment of this invention will partition each of those SSD into a tier 1 partition that is compressed by the drive using on-drive compression, and a tier 2 partition that stores data compressed by off-drive compression. For both embodiments and others that take advantage of the ideas expressed herein, the endurance, performance, and power advantages can be realized.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. An apparatus, comprising:
a storage array comprising:
at least one compute node comprising at least one processor and non-transitory computer-readable memory;
a first tier of non-volatile solid-state drives configured to be accessed by the at least one compute node, each drive of the first tier comprising on-drive data compression logic;
a second tier of non-volatile solid-state drives configured to be accessed by the at least one compute node, each drive of the second tier comprising on-drive data compression logic;
off-drive data compression logic;
a storage tiering engine configured to prompt storage of first data that is accessed relatively more frequently than second data on the first tier and prompt storage of the second data that is accessed relatively less frequently than the first data on the second tier; and
a data compression manager configured to:
enable the on-drive data compression logic of the drives of the first tier, the drives of the first tier being selected for enablement of their on-drive data compression logic based on having lower rated data access latency than a rated data access latency of the drives of the second tier;
disable the on-drive data compression logic of the drives of the second tier, the drives of the second tier being selected for disablement of their on-drive compression logic based on having higher rated data access latency than the rated data access latency of the drives of the first tier;
prompt compression of the second data with the off-drive compression logic and storage of compressed second data on the second tier; and
prompt the first data to be provided to the first tier uncompressed, the drives of the first tier configured to process the first data with the on-drive compression logic.

2. The apparatus of claim 1 wherein the data compression manager is configured to apply storage space savings from compression of the second data to available data storage space.

3. The apparatus of claim 2 wherein the data compression manager is configured to apply storage space savings from compression of the first data to over-provisioning.

4. The apparatus of claim 3 wherein the drives of the first tier are solid-state drives.

5. The apparatus of claim 4 wherein the off-drive compression logic utilizes a first compression algorithm, and the on-drive compression logic utilizes a second compression algorithm.

6. The apparatus of claim 4 wherein the off-drive compression logic utilizes a first compression window size, and the on-drive compression logic utilizes a second compression window size.

7. The apparatus of claim 1 wherein the data compression manager is configured to prompt compression of selected extents of the second data with the off-drive compression logic and storage of resulting compressed second data extents on a first partition of a first one of the managed drives of the second tier and prompt other extents of the second data to be provided to the first one of the managed drives uncompressed, the first one of the managed drives configured to process the other extents of the second data with the on-drive compression logic and store resulting compressed data extents in a second partition of the first one of the managed drives.

8. A method implemented by a storage array comprising at least one compute node having at least one processor and non-transitory computer-readable memory, a first tier of non-volatile solid-state drives configured to be accessed by the at least one compute node, each drive of the first tier comprising on-drive data compression logic, and a second tier of non-volatile solid-state drives configured to be accessed by the at least one compute node, each drive of the second tier comprising on-drive data compression logic, the method comprising:

enabling the on-drive data compression logic of the drives of the first tier, the drives of the first tier being selected for enablement of their on-drive data compression logic based on having lower rated data access latency than a rated data access latency of the drives of the second tier;

disabling the on-drive data compression logic of the drives of the second tier, the drives of the second tier being selected for disablement of their on-drive compression logic based on having higher rated data access latency than the rated data access latency of the drives of the first tier;

prompting storage of first data that is accessed relatively more frequently than second data on the first tier and prompting storage of the second data that is accessed relatively less frequently than the first data on the second tier;

prompting compression of the second data with the off-drive data compression logic and storage of compressed second data on the second tier; and     prompting the first data to be provided to the first tier uncompressed, the drives of the first tier processing the first data with the on-drive data compression logic.

9. The method of claim 8 comprising applying storage space savings from compression of the second data to available data storage space.

10. The method of claim 9 comprising applying storage space savings from compression of the first data to drive over-provisioning.

11. The method of claim 10 wherein the drives of the first tier have lower rated data access latency than a rated data access latency of the drives of the second tier due to the second tier using off-drive compression logic utilizing a first compression algorithm, and the first tier using on-drive compression logic utilizing a second compression algorithm.

12. The method of claim 11 comprising the off-drive compression logic utilizing a first compression window size, and the on-drive compression logic utilizing a second compression window size.

13. The method of claim 8 comprising the data compression manager prompting compression of selected extents of the second data with the off-drive compression logic and storage of resulting compressed extents of the second data on a first partition of a first one of the managed drives of the second tier and prompting other extents of the second data to be provided to the first one of the managed drives uncompressed, the first one of the managed drives configured to process the other extents of the second data with the on-drive compression logic and store resulting compressed data extents in a second partition of the first one of the managed drives.

14. A non-transitory computer-readable storage medium storing instructions that when executed by a storage array compute node cause the compute node to perform a method for storing data, the method comprising:

prompting storage of first data that is accessed relatively more frequently than second data on a first tier and prompting storage of second data that is accessed relatively less frequently than the first data on a second tier;

enabling on-drive data compression logic of solid-state drives of the first tier, the drives of the first tier being selected for enablement of their on-drive data compression logic based on having lower rated data access latency than a rated data access latency of the drives of the second tier;

disabling on-drive data compression logic of solid-state drives of the second tier, the drives of the second tier being selected for disablement of their on-drive compression logic based on having higher rated data access latency than the rated data access latency of the drives of the first tier;

prompting compression of the second data with off-drive data compression logic and storage of compressed second data on the second tier; and     prompting the first data to be provided to the first tier uncompressed, the drives of the first tier processing the first data with the on-drive data compression logic.

15. The non-transitory computer-readable storage medium of claim 14 wherein the method further comprises applying storage space savings from compression of the second data to available data storage space.

16. The non-transitory computer-readable storage medium of claim 15 wherein the method further comprises applying storage space savings from compression of the first data to over-provisioning.

17. The non-transitory computer-readable storage medium of claim 16 wherein the drives of the first tier have lower rated data access latency than a rated data access latency of the drives of the second tier and wherein the method further comprises off-drive compression logic utilizing a first compression algorithm, and the on-drive compression logic utilizing a second compression algorithm.

18. The non-transitory computer-readable storage medium of claim 17 wherein the method further comprises the off-drive compression logic utilizing a first compression window size, and the on-drive compression logic utilizing a second compression window size.

19. The non-transitory computer-readable storage medium of claim 14 wherein the method further comprises the data compression manager prompting compression of selected extents of the second data with the off-drive compression logic and storage of resulting compressed extents of the second data on a first partition of a first one of the managed drives of the second tier and prompting other extents of the second data to be provided to the first one of the managed drives uncompressed, the first one of the managed drives configured to process the other extents of the second data with the on-drive compression logic and store resulting compressed data extents in a second partition of the first one of the managed drives.

\* \* \* \* \*